US011573615B2

(12) United States Patent
Gao

(10) Patent No.: US 11,573,615 B2
(45) Date of Patent: Feb. 7, 2023

(54) ROTATIONAL POWER DELIVERY MODULE FOR SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 159 days.

(21) Appl. No.: 17/193,689

(22) Filed: Mar. 5, 2021

(65) Prior Publication Data

US 2022/0283615 A1    Sep. 8, 2022

(51) Int. Cl.
| | | |
|---|---|---|
| G06F 1/00 | (2006.01) | |
| G06F 1/18 | (2006.01) | |
| G06F 1/3203 | (2019.01) | |
| G06F 1/26 | (2006.01) | |

(52) U.S. Cl.
CPC ............ G06F 1/189 (2013.01); G06F 1/3203 (2013.01); *G06F 1/26* (2013.01)

(58) Field of Classification Search
CPC ............................... G06F 1/189; G06F 1/3203
USPC ......................................................... 713/300
See application file for complete search history.

(56) References Cited

U.S. PATENT DOCUMENTS

| | | | | |
|---|---|---|---|---|
| 4,731,703 A * | 3/1988 | Tsukaguchi | .......... | H05K 5/0247 361/679.02 |
| 6,330,161 B1 * | 12/2001 | Smith | .................... | G06F 1/181 16/265 |
| 8,187,028 B2 * | 5/2012 | Feigl | .................... | H05K 7/1457 439/540.1 |
| 8,472,183 B1 * | 6/2013 | Ross | .................. | H05K 7/20736 361/679.48 |
| 9,153,948 B2 * | 10/2015 | Salugu | ................. | H02B 11/127 |
| 10,362,704 B2 | 7/2019 | Hirano et al. | | |
| 10,660,231 B2 * | 5/2020 | Franz | .................. | H01R 25/006 |
| 2001/0026436 A1 * | 10/2001 | Tanzer | ................. | H01R 25/006 361/725 |
| 2008/0198536 A1 * | 8/2008 | Ewing | .................... | H02B 1/306 361/622 |
| 2015/0036272 A1 * | 2/2015 | Tachibana | ............... | G06F 1/189 361/679.4 |
| 2015/0076976 A1 * | 3/2015 | Bailey | .................. | H05K 5/0217 312/223.1 |

(Continued)

*Primary Examiner* — Volvick Derose
(74) *Attorney, Agent, or Firm* — Womble Bond Dickinson (US) LLP

(57) ABSTRACT

Embodiments are disclosed of a power delivery module that includes a power delivery board rotatable about a first axis between a first orientation and a second orientation. A first pair of electrical contacts, one positive and one negative, is on a first side of the board, and a second pair of electrical contacts, one positive and one negative, is on a second side of the board. The second positive contact is directly opposite the first negative contact and the second negative contact is directly opposite the first positive contact. A clip module is coupled to the power delivery board and includes a pair of power clips to engage with and electrically couple to the first or the second pairs of contacts. The clip module is rotatable about a second axis parallel to and spaced apart from the first axis between a first position where the power clips engage the first pair of contacts and a second position where the power clips engage the second pair of contacts.

20 Claims, 8 Drawing Sheets

(56) References Cited

U.S. PATENT DOCUMENTS

| | | | | |
|---|---|---|---|---|
| 2015/0214683 A1* | 7/2015 | Irons | ............... | H01R 13/46 |
| | | | | 439/652 |
| 2019/0045652 A1* | 2/2019 | Hirano | ............ | H05K 7/1492 |
| 2019/0215982 A1* | 7/2019 | Chen | ............ | H05K 7/183 |
| 2021/0398248 A1* | 12/2021 | Cox | ............ | G06T 7/74 |
| 2021/0400951 A1* | 12/2021 | Wang | ............ | A01M 29/16 |

* cited by examiner

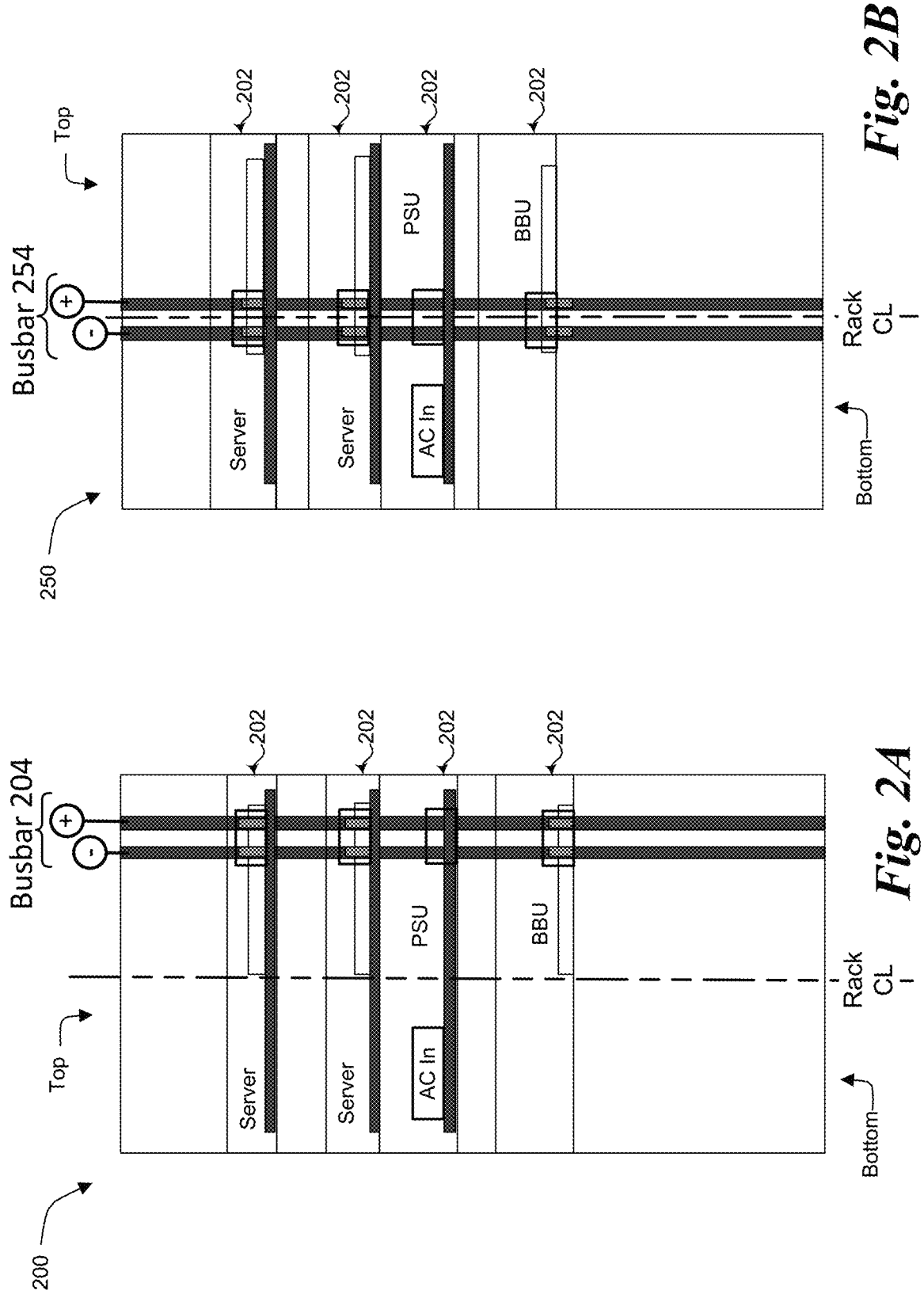

ROTATIONAL POWER DELIVERY MODULE FOR SERVERS

TECHNICAL FIELD

The disclosed embodiments relate generally to servers and in particular, but not exclusively, to a rotational module for supplying electric power to a server in a server rack, located in data centers.

BACKGROUND

Modern data centers, such as cloud computing centers, house enormous amounts of information technology (IT) equipment such as servers, blade servers, routers, edge servers, etc. These individual pieces of IT equipment are typically housed in racks within a computing center, with multiple pieces of IT equipment within each rack. The racks are typically grouped into clusters within the data center.

In both public cloud service and private cloud services, service providers might need to relocate servers from one data center cluster to another cluster within the same data center, or might even need to relocate and migrate servers from one data center site to another in a different geographic location. Relocating a server means moving it from one rack to another, but different data centers, and even different clusters within the same data center, can use different types of racks. This can create difficulties because design of the IT equipment must be compatible with the rack in which it's installed.

There are many different rack configurations, but although there are some industry standards—examples include OCP open racks, ODCC Scorpio racks, and so on—there can still be large configuration differences between rack standards. The racks differ in form factor, power delivery design, cooling method, and so on. This means IT equipment such as servers must be compatible with multiple rack specifications before they can be housed in a wide variety of racks; if not compatible, the IT equipment can be difficult to implement, and might not function properly, on different types of racks. This significantly limits the server and system designs and is a challenge to OEM vendors, rack vendors, server vendors, component suppliers, and the end users. Hardware cost is critical for cloud services businesses and internet services businesses, and interoperability is an important feature for reducing hardware cost. Previous IT equipment designs allow the design to be used only in one or a small number or rack types. This lack of interoperability is a major shortfall.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 2A-2B are rear views of embodiments of information technology (IT) racks.

FIG. 3A is a plan view of a first side of the board, FIG. 3B a plan view of a second side of the board, FIG. 3C a schematic drawing of the electrical connections on an embodiment of the board, and FIG. 3D is a cross-sectional view of the board taken substantially along section line D-D in FIG. 3C.

DETAILED DESCRIPTION

Figure 1:
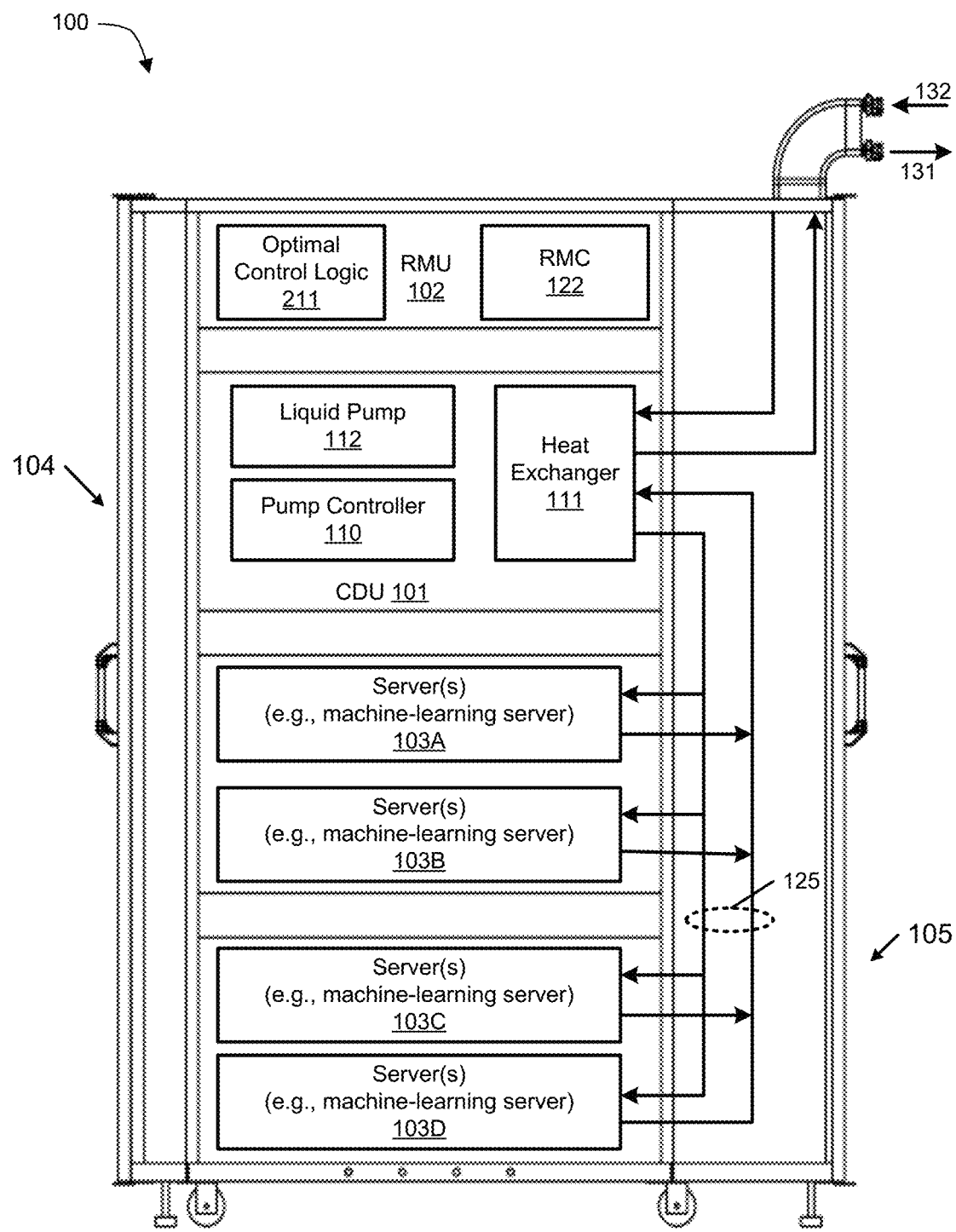
FIG. 1 is a side view of an embodiment of an information technology (IT) rack populated with various IT devices.

Embodiments are described of a baffle unit for improving airflow management, and thus improving cooling, in a hybrid-cooled system. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

Embodiments are described below of a rotational power delivery module having a rotatable power distribution board and a rotatable power clip module. The power distribution board is rotatable relative to a server chassis, and the power clip module is rotatable relative to the power distribution board. A safety pin or screw is used to ensure the power delivery module is retained in the proper orientation. The combined rotation of these two elements enables the power clip module to match different busbar architectures and locations in different racks while also ensuring that the corresponding positive and negative connections match the busbar designs. In operation, the power deliver board rotates 180 degrees and then the power clip module rotates 180 degrees. These two 180 degree rotations enable the power module to be adjusted to match different rack power architectures. Thus, the described embodiments improve the server and rack interoperability and enable dynamic adjustment of the server power delivery system location to assist forming better airflow within the server chassis. The described embodiments also improve serviceability of the power delivery design because, among other things, they can be operated without tools—i.e., the embodiments do not require physical hardware tools to operate or to service. To further improve serviceability, or reduce the need for service, the described embodiments include features that prevent improper operation.

FIG. 1 is a block diagram illustrating a side view of an embodiment of an electronics rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

Figure 3A:
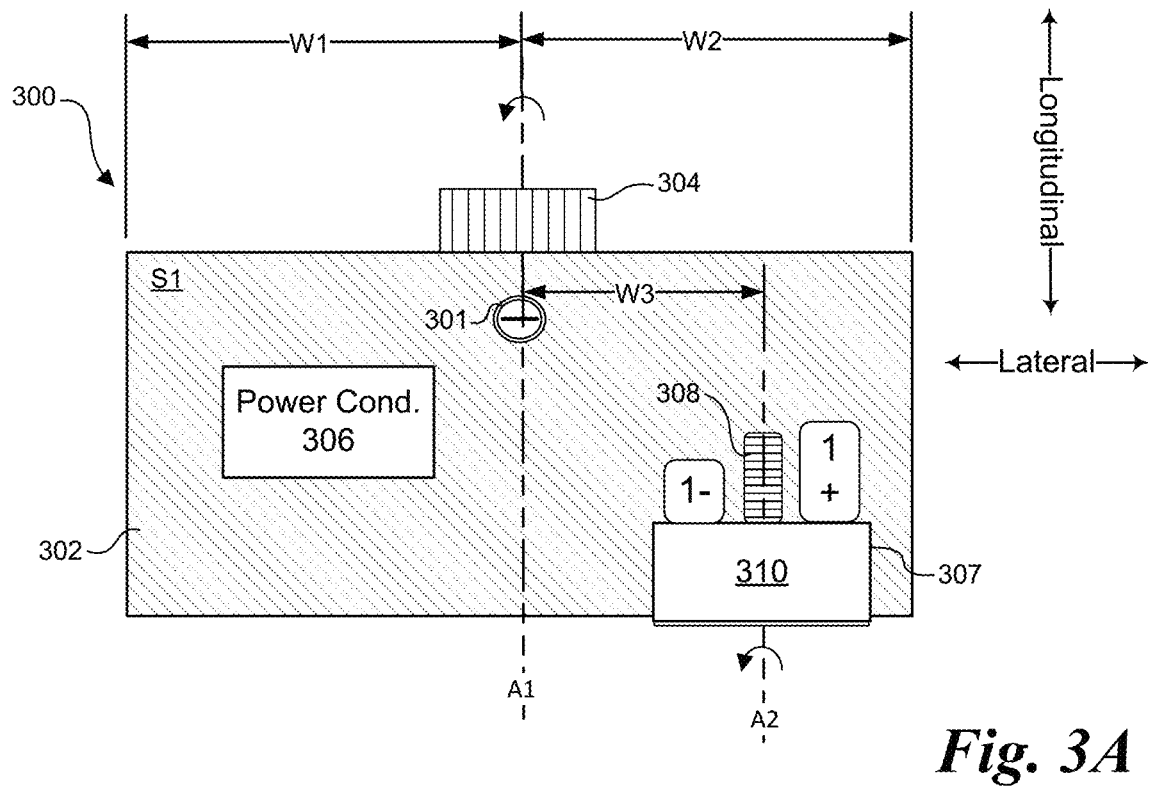
FIGS. 3A-3D are drawings of an embodiment of a power delivery board.
Figure 3B:
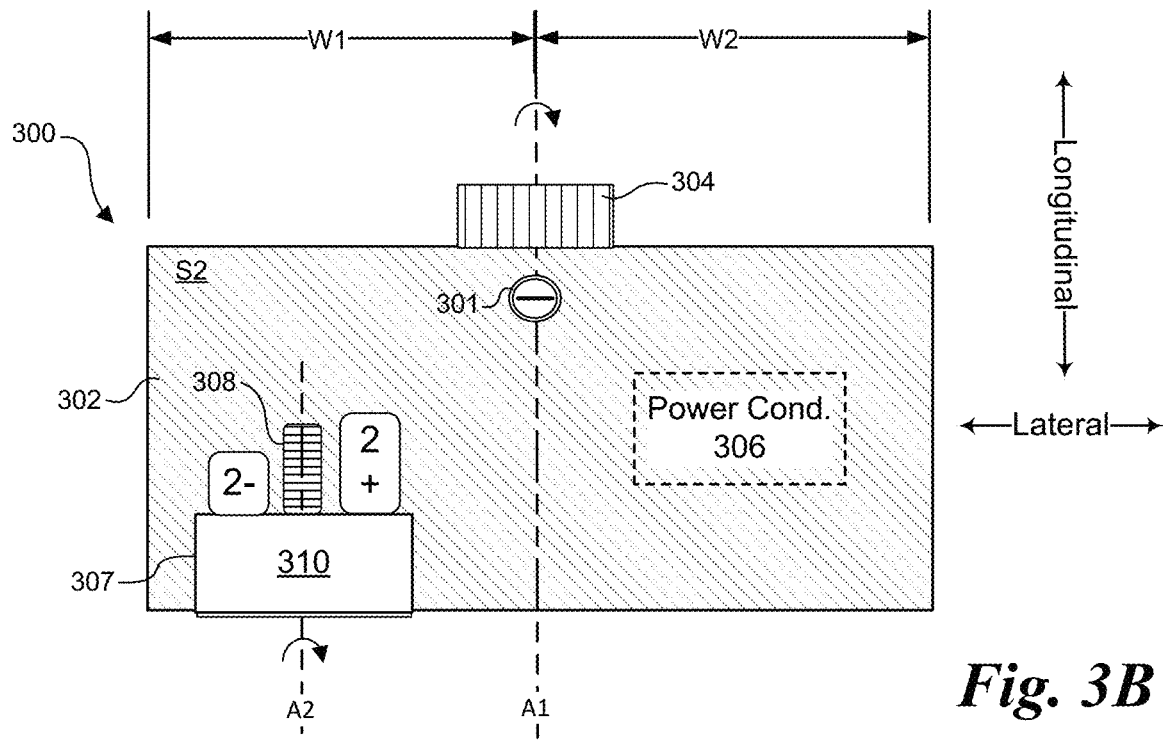

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a power deliver module, such as the ones shown in FIG. 3A et seq., can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

FIGS. 2A-2B illustrate embodiments of busbars in information technology (IT) racks. Both FIGS. 2A and 2B show racks when viewed from the rear. FIG. 2A illustrates an embodiment of a rack 200 having one or more pieces of IT equipment 202 housed therein in a vertical stack. Although IT equipment 202 is described below mainly as servers, in various embodiments IT equipment 202 can be any type of IT equipment that can be housed in a rack; examples include servers, graphics processing units (GPUs), power units, battery backup (BBU) units, power supply units (PSUs), cooling units, or some combination of these (see, e.g., FIG. 1). To provide electrical power to all the IT equipment in the rack, or all IT equipment that could be housed in the rack, busbar 204 extends over substantially the entire height of the rack, from bottom to top. Busbar 204 includes two bars that act as electrical contacts: a positive (+) bar and a negative (−) bar. It is an industry standard that the positive bar is on the right and the negative bar on the left, again when viewed from the rear of the rack. In the illustrated embodiment, busbar 204 is positioned to the right of the rack centerline, near the right side of the rack when viewed from the rear.

FIG. 2B illustrates an embodiment of a rack 250. Rack 250 is in most respects similar to rack 200: it has one or more servers 202 housed therein in a vertical stack and includes a busbar 254 that extends over substantially the entire height of the rack, from bottom to top, to supply electrical power to all servers that are or could be housed in the rack. Like busbar 204, busbar 254 includes two bars that server as electrical contacts: a positive (+) bar and a negative (−) bar, with the positive bar on the right and the negative bar on the left when viewed from the rear of the rack. The primary difference between racks 200 and 250 is the position of the busbar: instead of being to the right of the rack centerline, busbar 254 is positioned substantially along the centerline of the rack. To allow IT equipment 202 to be easily moved from rack 200 to rack 250, or the other way around, the servers 202 or the racks must include a power delivery module that can adapt to different busbar positions.

FIGS. 3A-3D together illustrate an embodiment of a power delivery module 300. Module 300 includes two main components: a power delivery board (PDB) 302 and a power clip module 310. PDB 302 is described below; details of power clip module 310 are described in connection with FIGS. 4A-4C.

Power delivery board 302 has a first side or surface S1 (shown in FIG. 2A) and a second side or surface S2 (shown in FIG. 2B). In one embodiment, first side S1 and second side S2 are planar and substantially parallel to each other and are spaced apart from each other by a thickness of board 302. In one embodiment board 302 is a printed circuit board, but in other embodiments it can be another type of board. Board 302 is rotatable about a first axis A1. In the figures, FIG. 2A shows first side S1 and FIG. 2B shows second side S2 as seen if board 302 is rotated 180 degrees about axis A1. In the illustrated embodiment a positioning screw or pin 301 is used to attach board 302 to a chassis such as a server chassis and to hold board 302, and hence power delivery module 300, in place. In other embodiments the mounting method may be different, so that positioning screw 301 may be slightly different or, in some applications, may be unnecessary.

In the illustrated embodiment first axis A1 is positioned substantially in the plane of the board and substantially in the middle of the board (i.e., W1=W2), but in other embodiments first axis A1 need not be in the plane of board 302 and need not be positioned in the middle of the board (i.e., W1≠W2). A rotatable connector 304—that is, a connector that can function in at least two orientations—is centered on axis A1 and is positioned along an edge of board 302; connector 304 can be used to connect power delivery board 300 to the main board of a server (see, e.g., FIGS. 6A-6B).

First side S1 of board 302 includes a first pair of spaced-apart electrical contacts, including a first negative contact (1−) and a first positive contact (1+). Second side S2 of board 302 includes a second pair of spaced-apart electrical contacts, including a second negative contact (2−) and a second positive contact (2+). The first and second pairs of electrical contacts are directly opposite each other on the board: first positive contact 1+ is directly on the opposite side of the board from second negative contact 2−, and first negative contact 1− is directly on the opposite side of the board from second positive contact 2+ (see FIG. 3D). Both pairs of electrical contacts are formed at or near the edge of a cut-out 307 formed in the edge of the board longitudinally opposite the edge where connector 304 is positioned.

A clip mounting channel 308 is formed or attached to board 302 in the plane of the board, and the mounting channel is positioned between the positive and negative electrical contacts in each of the two pairs of electrical contacts. Clip mounting channel 308 is designed to rotatably receive a clip module 310 so that the clip module can rotate about a second axis A2 defined by the clip mounting channel and/or a shaft of the clip module. In the illustrated embodiment, second axis A2 is substantially parallel to first axis A1 and is spaced apart from the first axis by a non-zero distance W3. At least part of power clip module 310 fits within cut-out 307, and the power clip module is designed to provide clips that electrically connect one of the two pairs of electrical contacts (1+/1− or 2+/2−) to a busbar. Details of clip module 310 are discussed below in connection with FIGS. 3A-3C.

Figure 3C:
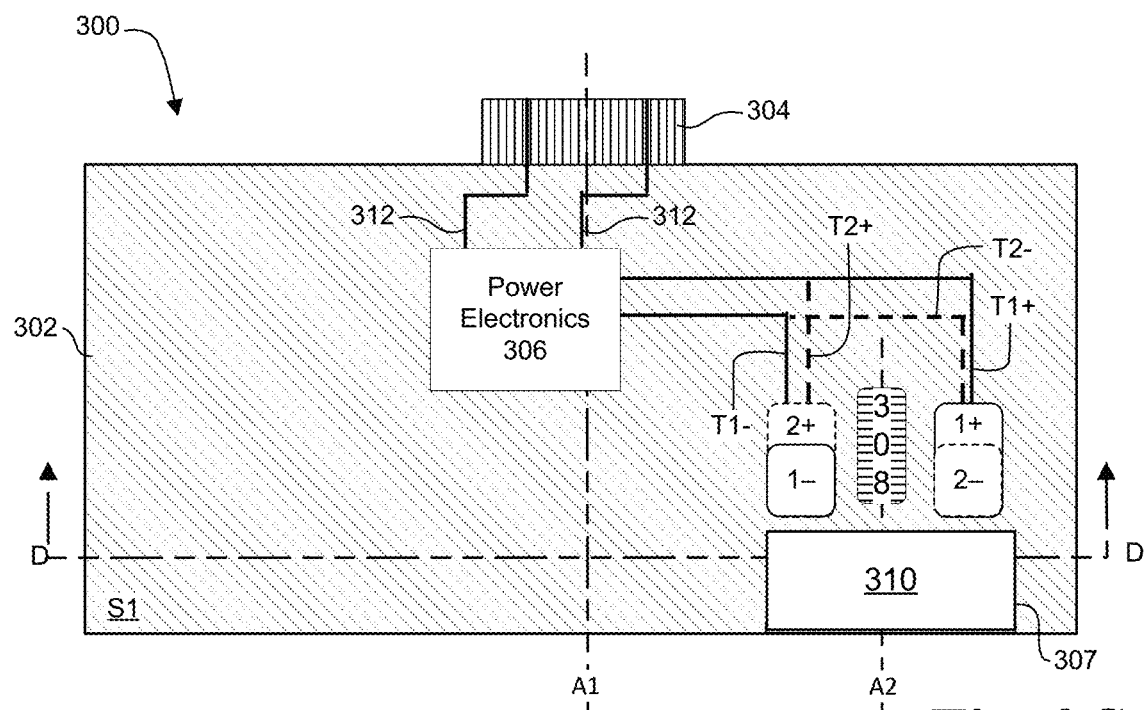

FIG. 3C illustrates the electrical connections between components on board 302. Power conditioning electronics 306 are mounted on one of surfaces S1 or S2. In the illustrated embodiment the power conditioning electronics are mounted on surface S1, so that it is shown in solid lines in a view of S1 (see FIG. 3A) and in dashed lines in a view of S2 (see FIG. 3B). The power conditioning electronics condition the power received from the busbar at one of the two pairs of electrical contacts (1+/1− or 2+/2−) before it is output to the IT equipment through connector 304. In various embodiments, power conditioning electronics 306 can include voltage regulators, rectifiers, or other power conditioning and control elements.

To ensure that the power electronics 306 can condition power received from electrical contacts 1+/1− on side S1 or from electrical contacts 2+/2− on side S2, board 302 includes traces or connections that electrically couple the first and second contact pairs to the power conditioning electronics, so that each pair of contacts has its own circuit routing to the power electronics. In the illustrated embodiment trace pair T1 on side S1, shown in solid lines, electrically couple the first pair of contacts 1+/1−, also shown in solid lines, to the power electronics. Trace pair T1 includes a trace T1+ that is coupled to contact 1+ and a trace T1− that is coupled to contact 1−. Similarly, trace pair T2 on side S2, shown in dashed lines, electrically couple the second pair of contacts 2+/2−, also shown in dashed lines, to the power electronics. Trace pair T2 includes a trace T2+ that is coupled to contact 2+ and a trace T2− that is coupled to contact 2−. Operation of power clip module 310, further described below, ensures that at any time only one of the two pairs of contacts (first pair 1+/1− or second pair 2+/2−) will direct electrical power to the power electronics. Because connector 304 will be used to connect the PDB to the IT equipment's main board regardless of the orientation of board 302, only a single pair of traces 312 is needed between the power electronics and connector 304.

Figure 3D:
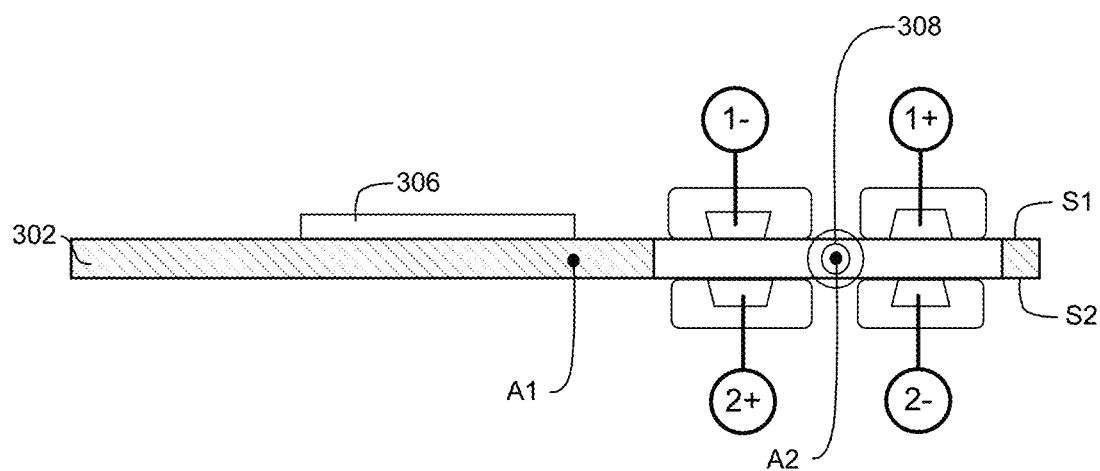

FIG. 3D illustrates the positioning of the pairs of electrical contacts on directly opposite sides of board 302. As also discussed above, first side S1 includes a first pair of spaced-apart electrical contacts, including a first negative contact (1−) and a first positive contact (1+). Second side S2 of board 302 includes a second pair of spaced-apart electrical contacts, including a second negative contact (2−) and a second positive contact (2+). The first and second pairs of electrical contacts are directly opposite each other on the board: first positive contact 1+ is directly on the opposite side of the board from second negative contact 2−, and first negative contact 1− is directly on the opposite side of the board from second positive contact 2+ (see FIG. 3D). Clip mounting channel 308 is positioned in board 302 in between the pair of oppositely-positioned electrical contacts.

As a safety feature to ensure proper connection of a positive power clip to a positive contact and a negative power clip to a negative contact (see, e.g., FIG. 4B), both positive contacts have one cross-sectional shape and both negative contacts have another. In the illustrated embodiment, positive contacts 1+ and 2+ both have trapezoidal shapes with the long parallel edge of the trapezoid on their respective surfaces (S1 for contact 1+ and S2 for contact 2+). Similarly, negative contacts 1− and 2− both have trapezoidal shapes with the short parallel edge of the trapezoid on their respective surfaces (S1 for contact 1− and S2 for contact 2−). Although both the positive and negative contacts have the same basic cross-sectional geometric shape (a trapezoid in this embodiment), for purposes of this disclosure different orientations of the same basic geometric shapes are considered different cross-sectional shapes. In other embodiments, the positive and negative contacts can have use different geometric shapes than shown. As an additional safety feature, within each pair of electrical contacts the positive and negative contacts can have different lengths; among other things, this gives immediate visual confirmation of which contact is positive and which negative.

Figure 4A:
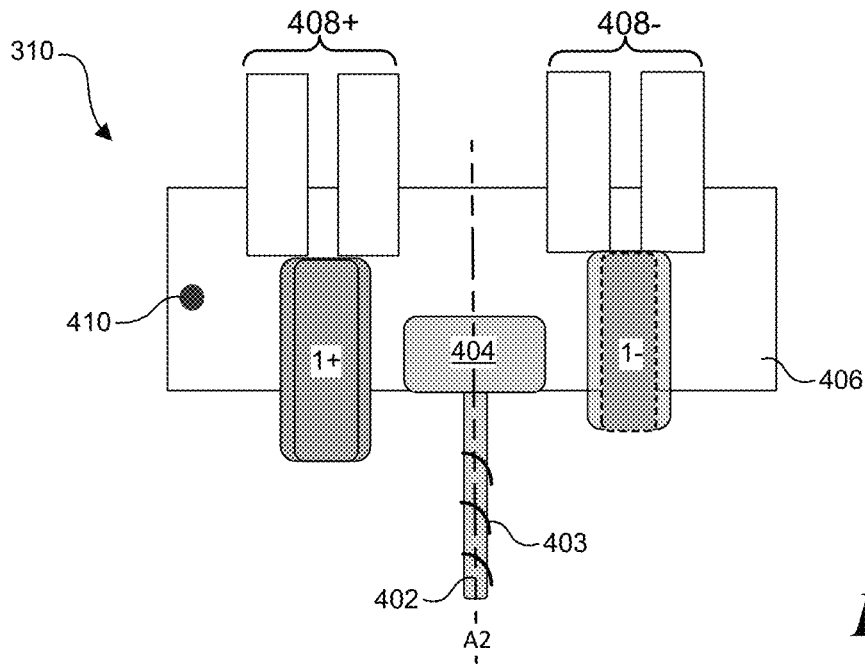
FIGS. 4A-4C are drawings of an embodiment of a power clip module that can be used with a power delivery board such as the one illustrated in FIGS. 2A-2D.
Figure 4B:
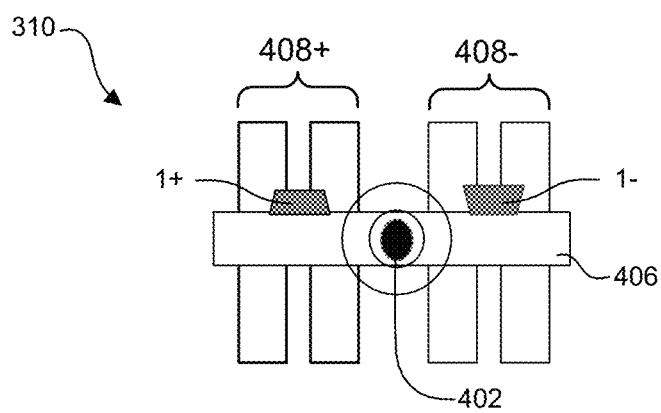

FIGS. 4A-4B together illustrate an embodiment of a clip module 310. FIG. 4A is a plan view, FIG. 4B a cross-sectional view. Clip module 310 includes a shaft 402 connected to a grip 404, and a board or substrate 406 connected to grip 404. Shaft 402 is sized and shaped so that it can be rotatable received inside clip mounting channel 308—that is, received in the clip mounting channel 308 in a way that allows the shaft to rotate within the channel (see, e.g., FIG. 3C). A spring 403 is positioned surrounding shaft 402.

In one embodiment, grip 404 can be a single plate that attaches to one surface of substrate 406, but in other embodiments grip 404 can be a pair of spaced-apart plates, so that one plate can be attached to one side of the substrate 406 and the other plate can be attached to the other side of substrate 406. In one embodiment, shaft 402 and grip 404 can be manufactured as a single piece, but in other embodiments, shaft 402 and grip 404 can be separate pieces that are attached together, for instance by a fastener. In one embodiment, substrate 406 is sized and shaped to fit in cut-out 307 in board 302. In the illustrated embodiment, substrate 406 is rigid and planar and has substantially the same thickness as board 302, but in other embodiments it need not be planar nor have the same thickness. In one embodiment, for instance, substrate 406 can be a small printed circuit board of a piece of printed circuit board.

Clips 408+ and 408− are attached to substrate 406. In the illustrated embodiment both clips extend above and below substrate 406 (see, e.g., FIG. 4B), but in other embodiments they need not extend above and below. Positive clip 408+ is adapted to receive the cross-sectional shape of positive contacts from board 302 (i.e., contacts 1+ and 2+), and negative clip 408− is adapted to receive the cross-sectional shape of the negative contacts on board 302 (i.e., contacts 1− and 2−). The sides positive clip 408+ and negative clip 408− that do not receive the electrical contacts (i.e., the side opposite where the electrical contacts are coupled) are adapted to be electrically coupled to a rack busbar. Although in the illustrated embodiment clips 408+ and 408− extend above and below board 406, at a given time clips 408+ and 408− will only be connected to one pair of contacts on board 302—either the first set of contacts 1+/1− on side S1 or the second set of contacts 2+/2− on side S2. Contacts 1+ and 1− are illustrated in FIGS. 4A-4B to illustrate how clips 408+ and 408− engage the electrical contacts, but the contacts are not part of clip module 310. As discussed above, as a safety feature the sides power clips 408+ and 408− that couple with the electrical contacts are designed in a customized shape, such as a trapezoidal shape, to ensure that each power clip can only be coupled to the correct electrical contact—i.e., positive clip to positive contact and negative clip to negative contact.

Figure 4C:
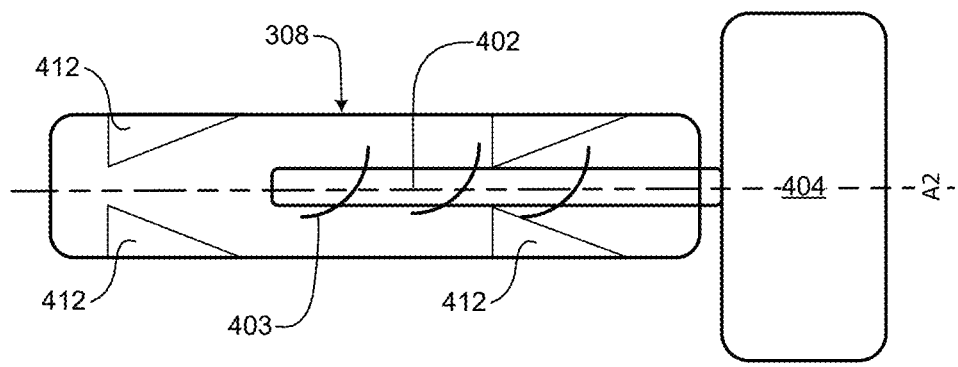

FIG. 4C illustrates an embodiment of a clip mounting channel 308 engaged with clip module 310. In operation, shaft 402 is rotatably inserted into clip mounting channel 308—i.e., inserted in a way that the shaft can rotate about its axis and the axis of the mounting channel (both of which correspond to second axis A2, see FIGS. 3A-3B). Clip mounting channel 308 can include one or more teeth 412 that engage shaft 402, so that shaft 402 remains in place within the clip mounting channel while allowing shaft 402 to rotate, meaning that the entire clip module 310 can also rotate. Teeth 412 have several functions: (i) they allow the clip module to be easily inserted in the mounting channel and fixed in the longitudinal direction once inserted; (ii) they allow the clip module to be moved axially (i.e., along axis A2); (iii) teeth 412 and spring 403 enable power clip 310 to be pulled out a certain distance and, after the power clip module is rotated, spring 403 provides a force to pull the power clip module back to the inserted location. Teeth 412 can be designed so that shaft 402 and spring 403, and hence clip module 310, can be removed from clip mounting channel 308 with the application of enough force. This ensures that clip module 310 can be replaced with another module if needed, for instance if clips 408+ or 408− become bent or otherwise damaged.

As an additional safety feature, clip module 310 can also include a structural rod 410 along one edge of substrate 406. Structural rod 410 projects substantially normally from the surface of substrate 406 (see, e.g., FIG. 5D). Structural rod 410 is a safety feature to prevent connection of clips 408+ and 408− to the wrong set of contacts by preventing rotation of the clip module 310 around shaft 402 to an orientation that would allow an improper connection. Structural rod 410 can also be used to help rotate the power clip module (see FIG. 5D).

FIGS. 5A-5D together illustrate an embodiment of the operation of a power delivery module such as power delivery module 310. The views shown in these figures are views from the rear of a rack. In the illustrated embodiment, power delivery module 310 is mounted to a server chassis (e.g., a server housing) 502 by a support 504; the server also includes other elements not shown in this drawing. Power deliver module 310 is rotatably attached to support 504 with axis A1 intersecting support 504. And, as described above, clip module 310 is rotatably coupled to board 302, so that clip module 310 rotates about axis A2.

Figure 5A:
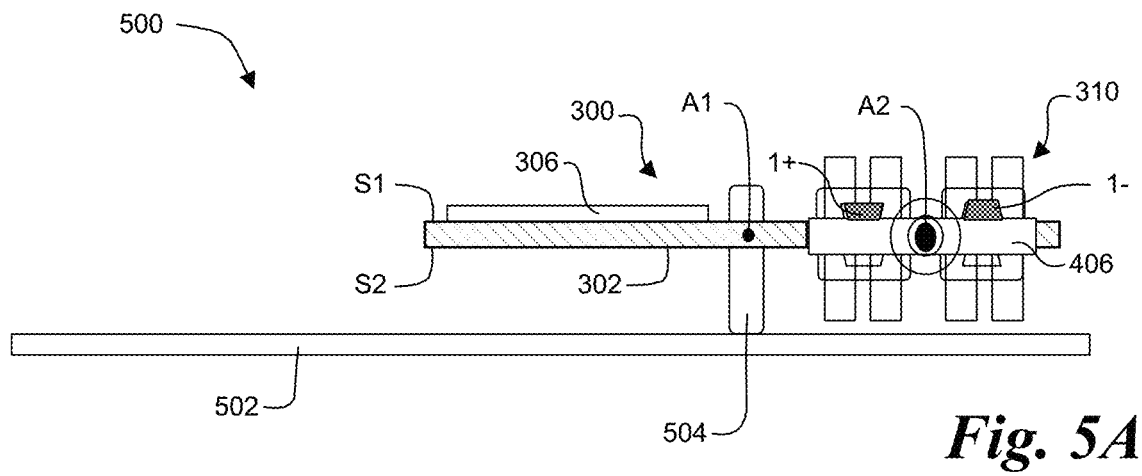
FIGS. 5A-5D are side views of an embodiment of a power delivery board and power clip module illustrating an embodiment of its operation.

FIG. 5A illustrates a position of power delivery module 300 that would be suitable for use in a rack whose busbar is on the right side of the rack when viewed from behind, as shown in FIG. 1A. In this position, the power deliver module is coupled to a busbar by the power clips, which in turn are electrically coupled to electrical contacts 1+ and 1− on side S1 of board 302. To allow the server to be used with a rack whose busbar is in the middle of the rack (see FIG. 1B), contact 304 (see FIGS. 3A-3C) is disconnected from the main board of the server and the power delivery module is rotated 180 degrees about axis A1, from the position shown in FIG. 5A to the position shown in FIG. 5B.

Figure 5B:
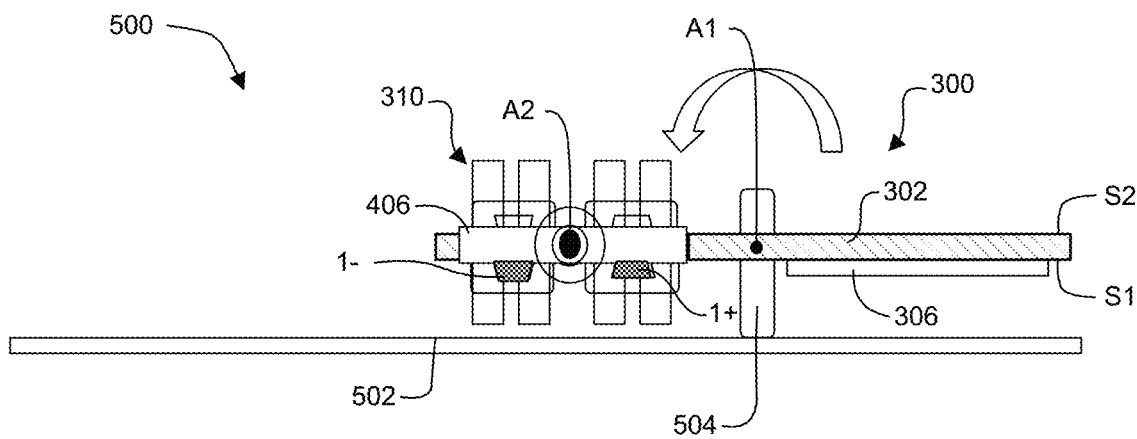
Figure 5C:
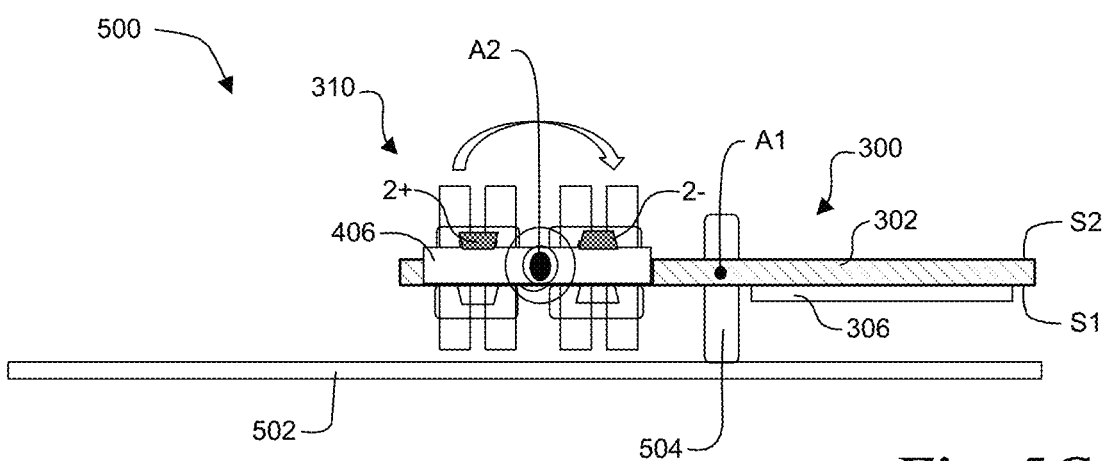

In the position shown in FIG. 5B, the power clips on clip module 310 are moved where they can connect to the center busbar, but they remain electrically coupled to electrical contacts 1+ and 1−, which because of the rotation of the module 300 between FIGS. 5A and 5B are the wrong set of contacts to make the proper positive-to-positive and negative-to-negative electrical connections to the busbar. To reorient the power clips so that they are correctly oriented and coupled to the correct set of contacts (i.e., contacts 2+/2− in FIG. 5B) the clip module is rotated 180 degrees, from the position of FIG. 5B to the position of FIG. 5C. In the orientation of FIG. 5C, then, the power clips are in both the correct position and the correct orientation to make an appropriate connection between electrical contacts 2+/2− and the central busbar (see also FIGS. 6A-6B). Connector 304 (see FIGS. 3A-3C), can then be inserted into the main board of the server to create an electrical power path from the busbar, through the power delivery module, to the server.

Figure 5D:
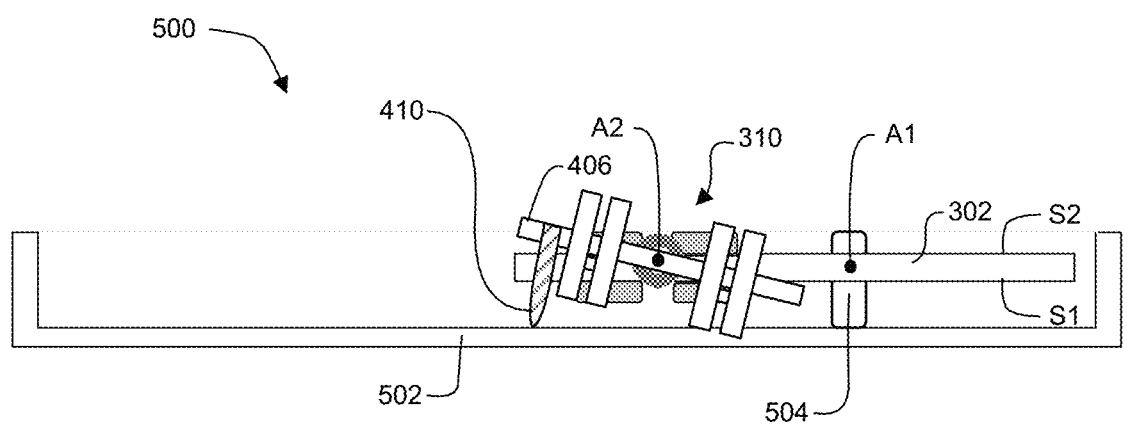

FIG. 5D illustrates the operation of structural rod 410 (see FIG. 4A). Structural rod 410 is a safety feature that projects from one side of clip module substrate 406 to prevent the clip module from being rotated into a position that would result in an inappropriate electrical connection. In the illustrated embodiment, structural rod 410 projects from substrate 406 in such a way that when power deliver Board 302 is rotated 180 degrees from the position of FIG. 5A to the position of FIG. 5B, the structural rod makes contact with the server chassis 502 and partially rotates the clip module. By rotating the clip module this way, structural rod 410 prevents the clip module 310 from remaining in its original orientation relative to board 302 (shown in FIG. 5A), which is not the appropriate clip position for the new orientation of board of FIG. 5B. Instead, the structural rod requires the clip module 310 to be rotated 180 degrees (clockwise in the illustrated view) about axis A2 to the new correct position of FIG. 5C before the clips can be coupled to the busbar. Structural rod 410 thus prevents incorrect implementation.

Figure 6A:
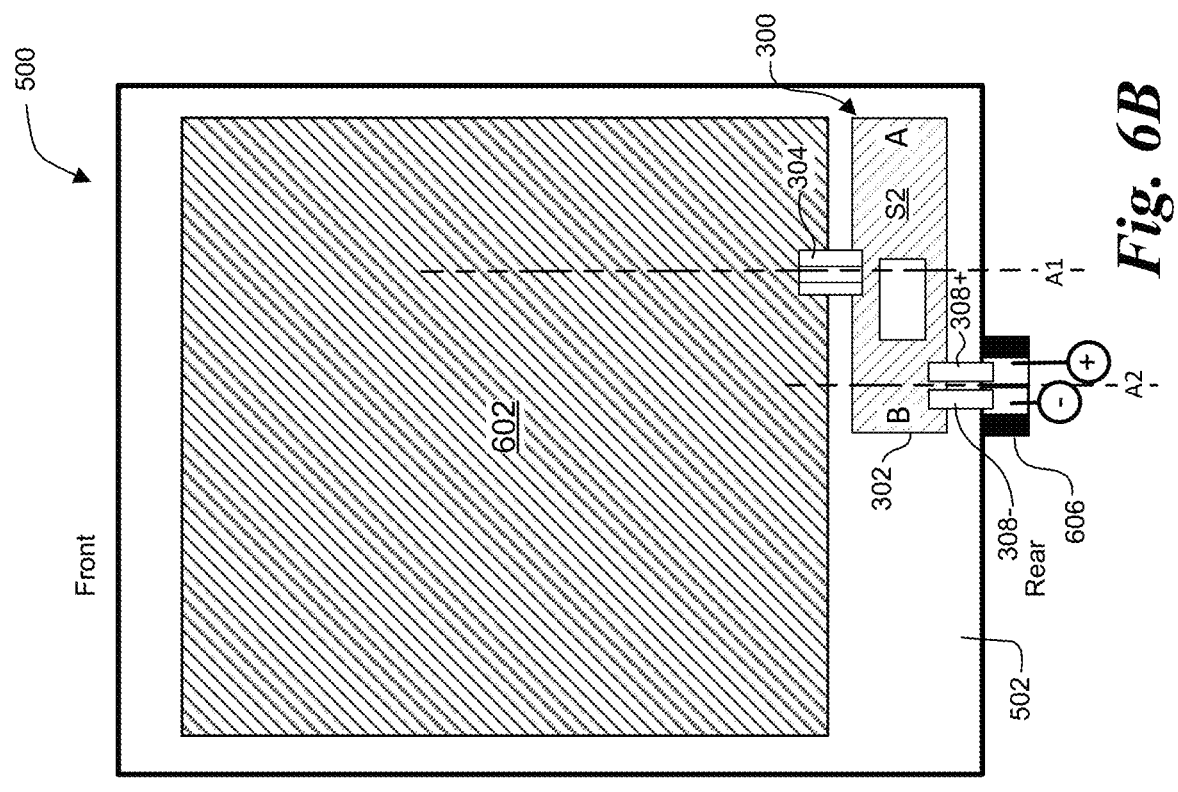
FIGS. 6A-6B are top views of an embodiment of a power delivery board used to deliver power to IT equipment in a rack illustrating an embodiment of its operation.
Figure 6B:
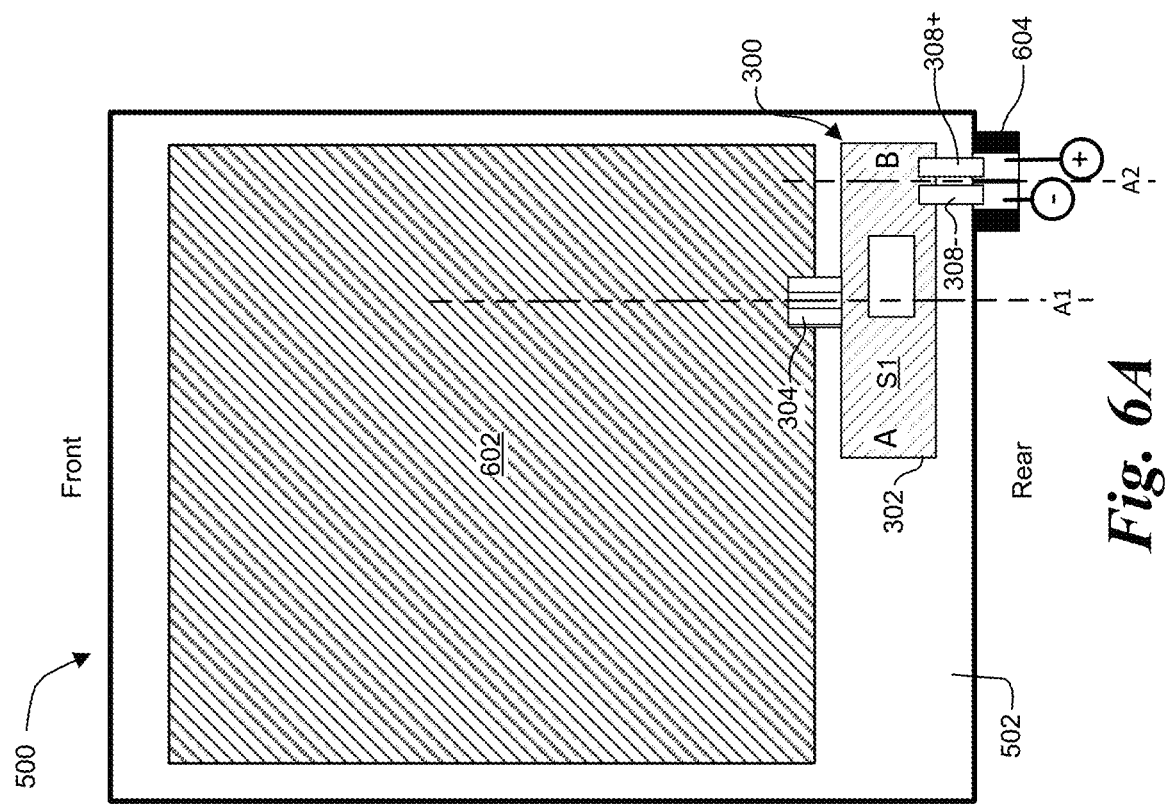

FIGS. 6A-6B illustrate, in plan view, the operation of a power delivery module 300 shown in side view in FIGS. 5A-5C. FIG. 6A illustrates power delivery module 300 in the orientation of FIG. 5A, and FIG. 6B illustrates the power deliver module in the orientation of FIG. 5C. As seen in FIG. 5A, the power deliver module 300 is positioned at the rear of chassis 502. Connector 304 is electrically coupled to the main board 602 of the IT equipment within the chassis. The first side S1 of board 302 is positioned facing upward, so that the clip module, and hence clips 308+ and 308−, are positioned near the right side of the chassis, where the clips can be electrically connected to the positive and negative rails of a busbar 604 positioned near the right side of a rack. In this orientation, lateral side A of board 302 is closest to the center of the rack and lateral side B is closest to the right side of the rack.

FIG. 6B illustrate the result when, starting with the configuration of FIG. 6A, board 302 is rotated 180 degrees about axis A1, and the clip module 310 is rotated 180 degrees about axis A2. In this configuration, connector 304—which, as described above, is rotatable so that it can connection with main board 602 in at least two orientations—is electrically coupled to the main board 602 of the IT equipment within the chassis. The second side S2 of board 302 is positioned facing upward, so that the clip module, and hence clips 308+ and 308−, are positioned near the middle of the chassis, where the clips can be electrically connected to the positive and negative rails of a busbar 606 positioned near the middle of a rack. In this orientation, lateral side A of board 302 is closest to the right side of the rack and lateral side B is closest to the center of the rack. It can be seen disclosed embodiments of a power deliver module allow servers to be interoperated on both rack architectures with different busbar locations. The embodiments can be also integrated to the other power components such as PSU and BBU. In other embodiments the form factor of the PDB can be designed and optimized based on the power delivery design such as busbar locations in different rack architectures and designs Other power delivery module embodiments are possible besides the ones described above. For instance:

The power connectors can be different and can have different numbers.

The solution may be used and slightly modified for different types of server chassis, such as 1U, 2U, and servers in half node form factors or sled form factors.

The PDB mounting supporting structure may be different for providing similar functions to integrate the PDB to the chassis.

The above description of embodiments is not intended to be exhaustive or to limit the invention to the described forms. Specific embodiments of, and examples for, the invention are described herein for illustrative purposes, but various modifications are possible.

What is claimed is:

1. A power delivery module comprising:
a power delivery board (PDB) having a first side and a second side and being rotatable about a first axis between a first orientation and a second orientation;
a first pair of electrical contacts positioned on the first side, the first pair of electrical contacts including a first positive contact and a first negative contact;
a second pair of electrical contacts positioned on the second side, the second pair of electrical contacts including a second positive contact positioned on the second side directly opposite the first negative contact and a second negative contact positioned on the second side directly opposite the first positive contact; and
a clip module coupled to the power delivery board, the clip module including a pair of power clips adapted to engage with and electrically couple the first pair of electrical contacts or the second pair of electrical contacts, wherein the power clip module is rotatable about a second axis that is parallel to and spaced apart from the first axis so that the clip module can rotate between a first position where the pair of power clips engage the first pair of electrical contacts and a second position where the pair of power clips engage the second pair of electrical contacts.

2. The power deliver module of claim 1 wherein the clip module comprises:
a shaft; and
a clip module substrate coupled to the shaft, wherein the pair of power clips are coupled to the clip module substrate.

3. The power delivery module of claim 2 wherein the PDB further comprises a clip mounting channel adapted to rotatably receive the shaft.

4. The power deliver module of claim 3 wherein the clip mounting channel includes one or more teeth to removably retain the shaft within the clip mounting channel.

5. The power delivery module of claim 2 wherein the clip module further comprises a structural rod projecting from a surface of the clip module substrate to prevent improper connection between the power clips and the electrical contacts.

6. The power delivery module of claim 1 wherein the first and second positive contacts have the same cross-sectional shape and the first and second negative contacts have the same cross-sectional shape, wherein the positive contacts have a different cross-sectional shape than the negative contacts, and, wherein each positive contact has a different length than its corresponding negative contact.

7. The power delivery module of claim 1, further comprising a rotatable connector mounted on the power deliver board and electrically coupled to the first pair of electrical contacts and the second pair of electrical contacts.

8. The power deliver module of claim 7, further comprising power electronics electrically coupled between the rotatable connector and the first and second pairs of electrical contacts.

9. The power delivery module of claim 8 wherein only one at a time of the first pair of electrical contacts or the second pair of electrical contacts is coupled to the power electronics.

10. The power delivery module of claim 1 wherein the first axis and the second axis are within the PDB.

11. The power delivery module of claim 1, wherein the first and second pairs of electrical contacts are positioned at a non-zero distance from the first axis so that there is a displacement of the first and second pairs of electrical contact between the first orientation and the second orientation.

12. An information technology apparatus comprising:
a main board having electronic components disposed thereon;
a power delivery module electrically coupled to the main board, the power delivery module comprising:
a power delivery board (PDB) having a first side and a second side and being rotatable about a first axis between a first orientation and a second orientation, a first pair of electrical contacts positioned on the first side, the first pair of electrical contacts including a first positive contact and a first negative contact, a second pair of electrical contacts positioned on the second side, the second pair of electrical contacts including a second positive contact positioned on the second side directly opposite the first negative contact and a second negative contact positioned on the second side directly opposite the first positive contact, and a clip module coupled to the power delivery board, the clip module including a pair of power clips adapted to engage with and electrically couple the first pair of electrical contacts or the second pair of electrical contacts, wherein the power clip module is rotatable about a second axis that is parallel to and spaced apart from the first axis so that the clip module can rotate between a first position where the pair of power clips engage the first pair of electrical contacts and a second position where the pair of power clips engage the second pair of electrical contacts; and a rotatable connector mounted on the PDB to electrically couple the power delivery module to the main board.

13. The information technology apparatus of claim 12 wherein the clip module comprises:
a shaft; and
a clip module substrate coupled to the shaft, wherein the pair of power clips are coupled to the clip module substrate.

14. The information technology apparatus of claim 13 wherein the PDB further comprises a clip mounting channel adapted to rotatably receive the shaft.

15. The information technology apparatus of claim 14 wherein the clip mounting channel includes one or more teeth to removably retain the shaft within the clip mounting channel.

16. The information technology apparatus of claim 13 wherein the clip module further comprises a structural rod projecting from a surface of the clip module substrate to prevent improper connection between the power clips and the electrical contacts.

17. The information technology apparatus of claim 12 wherein the first and second positive contacts have the same cross-sectional shape and the first and the first and second negative contacts have the same cross-sectional shape, wherein the positive contacts have a different cross-sectional shape than the negative contacts, and wherein each positive contact has a different length than its corresponding negative contact.

18. The information technology apparatus of claim 12, further comprising a support to couple the power delivery module to a chassis within which the main board is located, wherein the power delivery module is coupled to the support along the first axis.

19. The information technology apparatus of claim 18, further comprising power electronics electrically coupled between the rotatable connector and the first and second pairs of electrical contacts.

20. An electronic rack of a data center, comprising:
a plurality of server chassis arranged in a stack, each of the server chassis comprising:
a main board having electronic components disposed thereon;
a power delivery module electrically coupled to the main board, the power delivery module comprising:
a power delivery board (PDB) having a first side and a second side and being rotatable about a first axis between a first orientation and a second orientation,
a first pair of electrical contacts positioned on the first side, the first pair of electrical contacts including a first positive contact and a first negative contact,
a second pair of electrical contacts positioned on the second side, the second pair of electrical contacts including a second positive contact positioned on the second side directly opposite the first negative contact and a second negative contact positioned on the second side directly opposite the first positive contact, and
a clip module coupled to the power delivery board, the clip module including a pair of power clips adapted to engage with and electrically couple the first pair of electrical contacts or the second pair of electrical contacts, wherein the power clip module is rotatable about a second axis that is parallel to and spaced apart from the first axis so that the clip module can rotate between a first position where the pair of power clips engage the first pair of electrical contacts and a second position where the pair of power clips engage the second pair of electrical contacts; and
a rotatable connector mounted on the PDB to electrically couple the power delivery module to the main board.

* * * * *